(12) United States Patent
Jeong et al.

(10) Patent No.: US 7,795,635 B2
(45) Date of Patent: Sep. 14, 2010

(54) BACKLIGHT UNIT EQUIPPED WITH LIGHT EMITTING DIODES

(75) Inventors: Gi Ho Jeong, Busan (KR); Jae Wook Kwon, Seoul (KR); Dong Jin Kim, Seoul (KR); Yoon Tak Yang, Hwaseong-si (KR); Hyeong Won Yun, Yongin-si (KR); Hyun Ho Lee, Gyunggi-do (KR); Jeong Hoon Park, Gyunggi-do (KR)

(73) Assignee: Samsung LED Co., Ltd., Gyunggi-do (KR)

( * ) Notice: Subject to any disclaimer, the term of this patent is extended or adjusted under 35 U.S.C. 154(b) by 3 days.

(21) Appl. No.: 11/714,193

(22) Filed: Mar. 6, 2007

(65) Prior Publication Data

US 2007/0221941 A1     Sep. 27, 2007

(30) Foreign Application Priority Data

Mar. 6, 2006   (KR) .................... 10-2006-0021010

(51) Int. Cl.
*H01L 33/64*     (2010.01)
(52) U.S. Cl. ........... 257/99; 257/E33.056; 257/E33.075
(58) Field of Classification Search .................... 257/99, 257/712, 713, 774, 775, E33.075, E33.056, 257/773, 88, 717, 718, E33.057; 438/106
See application file for complete search history.

(56) References Cited

U.S. PATENT DOCUMENTS 6,065,823 A *  5/2000  Kawamura .................... 347/18

| | | | |
|---|---|---|---|
| 6,920,046 B2 * | 7/2005 | Spryshak | 361/704 |
| 6,999,318 B2 * | 2/2006 | Newby | 361/719 |
| 7,456,499 B2 * | 11/2008 | Loh et al. | 257/710 |
| 2004/0184272 A1 * | 9/2004 | Wright et al. | 362/373 |
| 2005/0067953 A1 * | 3/2005 | Yamazaki et al. | 313/506 |

FOREIGN PATENT DOCUMENTS

JP     2005-283852     10/2005

OTHER PUBLICATIONS

Japanese Office Action issued in Japanese Patent Application No. 2007-055384, dated Nov. 17, 2009.

* cited by examiner

*Primary Examiner*—Victor A Mandala
*Assistant Examiner*—Scott Stowe
(74) *Attorney, Agent, or Firm*—McDermott Will & Emery LLP

(57) ABSTRACT

Disclosed herein is a backlight unit equipped with LEDs. The backlight includes an insulating substrate, a plurality of LED packages, an upper heat dissipation plate, and a lower heat dissipation plate. The insulating substrate is provided with predetermined circuit patterns. The LED packages are mounted above the insulating substrate, and are electrically connected to the circuit patterns. The upper heat dissipation plate is formed on the insulating substrate, and is configured to come into contact with the circuit patterns and to dissipate heat. The lower heat dissipation plate is formed on the insulating substrate, and is configured to transmit heat transmitted through the upper heat dissipation plate. The upper heat dissipation plate and the lower heat dissipation plate are connected to each other by at least one through hole, and the through hole and the upper heat dissipation plate have a predetermined area ratio.

16 Claims, 2 Drawing Sheets

BACKLIGHT UNIT EQUIPPED WITH LIGHT EMITTING DIODES

CROSS REFERENCE TO RELATED APPLICATION

This application claims the benefit of Korean Patent Application No. 10-2006-0021010, filed on Mar. 6, 2006, entitled "Backlight Unit provided with Light Emitting Diodes thereon," which is hereby incorporated by reference in its entirety into this application.

BACKGROUND OF THE INVENTION

1. Field of the Invention

The present invention relates generally to a backlight unit installed in a Liquid Crystal Display (LCD) and, more particularly, to a backlight unit that is capable of effectively dissipating the large quantity of heat that is generated by Light-Emitting Diodes (LEDs), which are light sources.

2. Description of the Related Art

A backlight unit is a device that is installed in an LCD using the principle in which liquid crystals change their molecular arrangement according to applied voltage, and provides light and illuminates a screen from behind. Although such backlight units were mainly formed of cold-cathode tubes, LEDs have attracted attention as backlight units due to the advantages with respect to life span, brightness, color reproducibility, etc.

When LEDs are used as light sources, LEDs require substrates, unlike cold-cathode tubes. Since LEDs emit large quantities of heat while radiating light, metal core substrates (metal core printed circuit boards) having an excellent heat dissipation characteristic have been used. Although metal core substrates have an excellent heat dissipation characteristic, they are very expensive. Accordingly, the high cost of the metal core substrates is one of the principal factors that impede the cost competitiveness of the backlight units formed of the metal core substrates. As a result, there is a trend toward the use of relatively inexpensive epoxy resin insulating substrates. An example of a conventional backlight unit in which LEDs are mounted on such an insulating substrate is illustrated in FIG. 4.

As illustrated in FIG. 4, a backlight unit 200 includes an insulating substrate 210, a plurality of LED packages 230 and a chassis 250.

Circuit patterns 211 and 212 are formed on the insulating substrate 210 by coating an epoxy resin FR4-core with a copper foil and etching the copper foil.

Each of the LED packages 230 is mounted such that an LED chip 231 is directly connected to one LED electrode 232 and is wire-bonded to the other LED electrode 233.

The LED chip 231 and the LED electrodes 232 and 233 are placed within a plastic mold casing 234, and the casing 234 is covered with an epoxy resin lens 235.

The LED package 230 is mounted on the insulating substrate 210, and is electrically connected to positive and negative electrodes, that is, the circuit patterns 211 and 212.

The chassis 250 is made of material having excellent thermal conductivity, such as metal, and is placed below the insulating substrate 210 with a heat pad 270 placed therebetween so as to provide electrical insulation and decrease contact thermal resistance.

In the conventional backlight unit 200, a thermal resistance obtained using the equation R=L/KA is about 63.5 K/W, which is very high, when the thickness L of a substrate is 0.8 mm, the thermal conductivity K of the substrate is 0.35, and the area A of the substrate is 36 $mm^2$.

As a result, the conventional backlight unit having the above-described construction exhibits the very poor thermal conductivity of the insulating substrate, therefore it is difficult to effectively eliminate heat generated by the LED chips, with the result that the temperature of the LED chips continuously increases. Accordingly, the amount of light emitted by the LED chips decreases, variation in wavelength occurs, and the reliability of the LED chips decreases, thus resulting in a reduced lifespan.

SUMMARY OF THE INVENTION

Accordingly, the present invention has been made keeping in mind the above problems occurring in the prior art, and an object of the present invention is to provide a backlight unit, which employs an inexpensive insulating substrate as a substrate and can effectively dissipate the large quantity of heat generated in LED chips, which are light sources.

In order to accomplish the above object, the present invention provides a backlight unit equipped with LEDs, including an insulating substrate provided with predetermined circuit patterns on one surface thereof; a plurality of LED packages mounted above the insulating substrate and electrically connected to the circuit patterns; an upper heat dissipation plate formed on the insulating substrate, and configured to come into contact with the circuit patterns and to dissipate heat generated in the LED packages; and a lower heat dissipation plate formed on a remaining surface of the insulating substrate, and configured to transmit heat transmitted through the upper heat dissipation plate; wherein the upper heat dissipation plate and the lower heat dissipation plate are connected to each other by at least one through hole that passes through the insulating substrate and is plated with plating material on an inner wall thereof, and the through hole and the upper heat dissipation plate have a predetermined area ratio.

The upper heat dissipation plate and the lower heat dissipation plate may be made of copper and each have a thickness of about 0.35 μm.

The area ratio of the through hole and the upper heat dissipation plate may range from 1:10 to 1:300.

The insulating substrate may be provided with an insulating film, and the insulating film may be configured to cover the lower heat dissipation plate and may be applied through sputtering or spraying.

The insulating film may have a thickness of about 0.35 μm.

BRIEF DESCRIPTION OF THE DRAWINGS

The above and other objects, features and advantages of the present invention will be more clearly understood from the following detailed description taken in conjunction with the accompanying drawings, in which.

DESCRIPTION OF THE PREFERRED EMBODIMENTS

Figure 1:
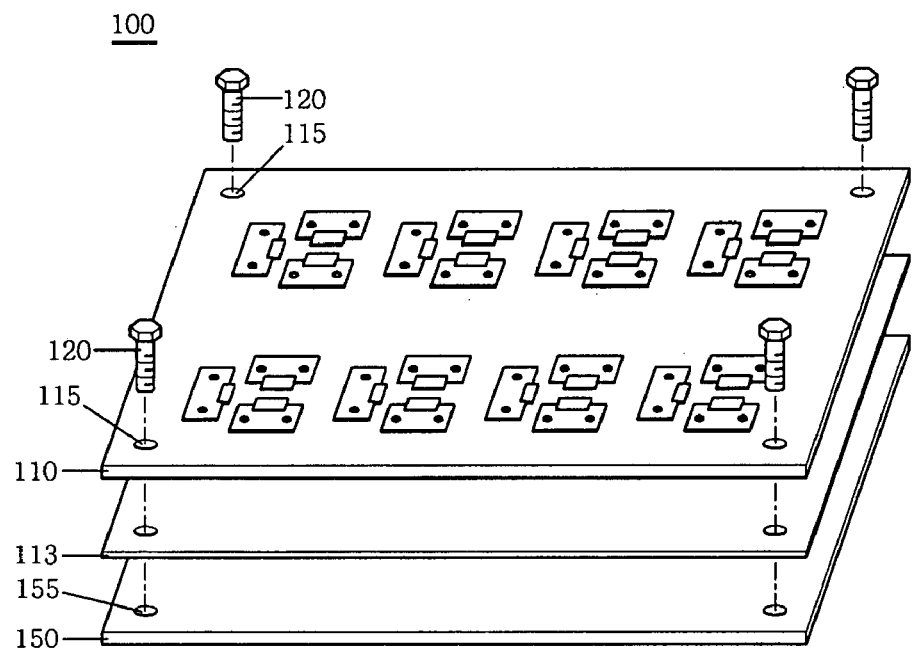
FIG. 1 is a schematic diagram showing a backlight unit equipped with LEDs according to a preferred embodiment of the present invention.

Reference now should be made to the drawings, in which the same reference numerals are used throughout the different drawings to designate the same or similar components.

With reference to the accompanying drawings, a backlight unit equipped with LEDs according to a preferred embodiment of the present invention is described in detail below.

As shown in FIG. 1, a backlight unit 100 according to the present embodiment includes a backlight module which includes a substrate 110 and a plurality of LED packages 130, and a chassis 150 on which the backlight module is fixedly mounted.

The substrate 110 is formed by coating an epoxy resin FR4-core, that is, an insulating substrate, with a copper foil and forming circuit patterns (not shown) through an etching process. Furthermore, the substrate 110 is thinly coated with insulating material on the bottom surface thereof, thereby forming an insulating film 113, different from a conventional heat pad.

Since an insulating substrate other than a metal substrate is used as the substrate 110, the cost of the backlight unit 100 is reduced, and the cost of the LCD, on which the backlight unit 100 is mounted, can also be reduced.

The LED packages 130 form a plurality of sets of LED packages for emitting red light, green light and blue light, and the plurality of sets of LED packages are mounted on the substrate 110 in accordance with design.

The chassis 150 is a part that forms the casing of the backlight unit 100, and is made of metallic material having excellent thermal conductivity, such as aluminum or copper. It is preferred that the chassis 150 be made of aluminum material so as to reduce the weight thereof.

The substrate 110 and the chassis 150 are fixedly combined with each other using a fastening means, such as bolts 120 that pass through through holes 115 and 155 formed through the corners of the substrate 110.

Figure 2:
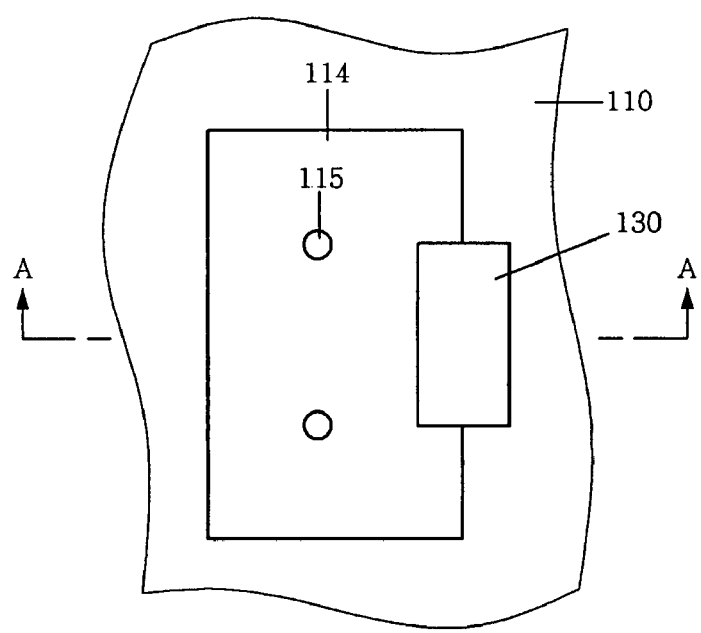
FIG. 2 is an enlarged partial plan view showing the principal parts of the backlight unit of FIG. 1.
Figure 3:
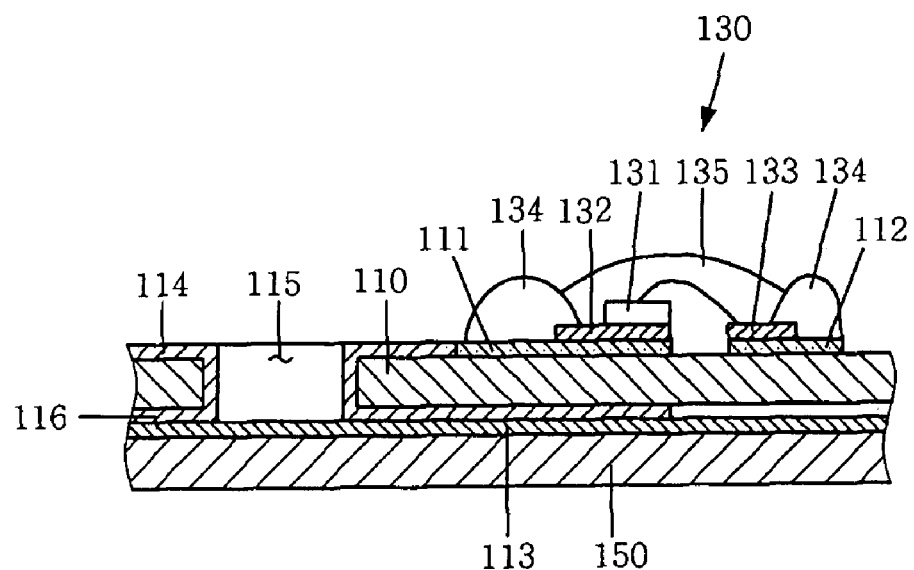
FIG. 3 is a schematic partial sectional view taken along line A-A of FIG. 2.
Figure 4:
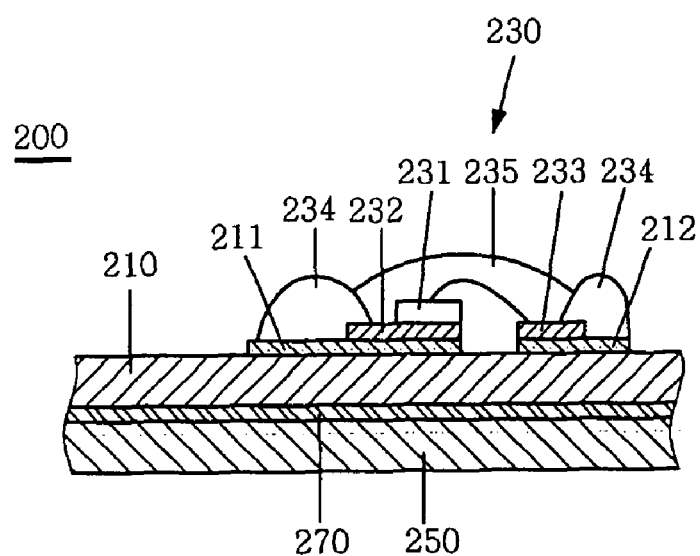
FIG. 4 is a schematic partial sectional view showing a conventional backlight unit equipped with LEDs.

With reference to FIGS. 2 and 3, which are enlarged views of the principal parts of the backlight unit 100, the backlight unit 100 is described in detail.

The backlight unit 100 shown in FIGS. 2 and 3 includes a substrate 110, a plurality of LED packages 130 and a chassis 150.

The substrate 110 is an insulating substrate, and is provided with circuit patterns 111 and 112 on the upper surface thereof using a copper foil. The insulating film 113 is formed by coating the substrate 110 with insulating material on the bottom surface thereof. In this case, a coating method may be one of the various methods, such as sputtering and spraying.

Furthermore, upper and lower heat dissipation plates 114 and 116 are respectively formed on the upper and lower surfaces of the substrate 110 so as to dissipate heat generated in the LED packages 130. In particular, the upper heat dissipation plate 114 comes into direct contact with the circuit pattern 111.

Since, in the present embodiment, the insulating material used as the insulating film 113 can be formed to have thermal conductivity lower than that of a conventional heat pad and a very thin thickness of, for example, 0.35 μm, it can achieve low thermal resistance.

As an example, a conventional heat pad having a thickness of about 0.2 mm has a heat resistance of about $2*10^{-4}$ W/K per unit area, whereas the insulating film 113 of the present embodiment has a thermal resistance of about $5.8*10^{-5}$ W/K, which corresponds to a thermal resistance reduction of about 71%.

Two through holes 115 are formed through the substrate 110 and the upper and lower heat dissipation plates 114 and 116 perpendicular to the substrate 110. The two through holes 115 are plated with copper on the inner walls thereof, therefore the upper and lower heat dissipation plates 114 and 116 formed on the upper and lower surfaces of the substrate 110 are connected to each other. As a result, heat generated in the LED packages 130 can be conducted through the upper heat dissipation plate 114 to the lower heat dissipation plate 116 and can then be dissipated to the chassis 150.

Since the upper and lower heat dissipation plates 114 and 116 are made of material having excellent thermal conductivity such as copper, the effect of heat dissipation increases in proportion to the areas thereof. It is preferable to design the areas of the upper and lower heat dissipation plates 114 and 116 to be as large as possible in consideration of other external conditions, that is, the number of LEDs and the overall area of the substrate.

Meanwhile, since the through holes 115 are only plated with copper on the inner walls thereof, but are not filled with filling material, the weight and cost of the backlight unit 100 can be reduced.

In this case, as the number of through holes 115 increases, the amount of heat conducted from the upper heat dissipation plate 114 to the lower heat dissipation plate 116 increases, thus resulting in an increase in the amount of heat dissipated through conduction. However, in the case where a large number of through holes 115 is formed, the area of the upper heat dissipation plate 114 is decreased, thus resulting in a decrease in the amount of heat dissipated through convection.

Accordingly, it is preferable to form the through holes 115 so that the amount of heat dissipated through conduction and the amount of heat dissipated through convection can be maximized. For this purpose, in the present embodiment, the through holes 115 and the upper heat dissipation plate 114 are formed such that the ratio of the areas thereof is about 1:129. However, it is preferred that the ratio be within a range of 1:10 to 1:300.

Each of the LED packages 130 includes an LED chip 131, LED electrodes 132 and 133, a plastic mold casing 134 and a lens 135.

The LED chip 131 is a means for emitting red light, green light or blue light, and is directly mounted on one LED electrode 132 and is electrically connected to another LED electrode 133 through wire bonding.

The LED electrode 132 is mounted on the positive one 111 of the circuit patterns 111 and 112 formed on the substrate 110, whereas the LED electrode 133 is mounted on the negative one 112 of the circuit patterns 111 and 112.

The LED chip 131 and the LED electrodes 132 and 133 are protected from the outside by a plastic mold casing 134, and the casing 134 is covered with the epoxy resin transparent lens 135.

The chassis 150 is made of material having excellent thermal conductivity, such as metal, and is placed under the insulating substrate 110.

In the present embodiment, the thickness of the substrate 110 is about 0.8 mm, each of the thicknesses of the upper and lower heat dissipation plates 114 and 116 and the insulating film 113 is about 0.35 μm, the area of the insulating film 113 is about 36 mm$^2$, and the diameter of the through holes 115 is about 0.3 mm.

When thermal resistance is calculated based on the above-described dimensions, $$R = \{1/R_{air} + 1/R_{copper} + 1/R_{substrate}\}^{-1}$$
$$= \{(KA/L)_{air} + (KA/L)_{copper} + (KA/L)_{substrate}\}^{-1}$$
$$= \{(0.03*0.0831*10^{-6})/(1.8*10^{-3}) +$$
$$(401*0.0582*10^{-6})/(0.8*10^{-3}) +$$
$$(0.35*35.8587*10^{-6})/(0.8*10^{-3})\}^{-1}$$
$$= 22.3\, K/W$$

This value is a value that corresponds to about 35% of a thermal resistance of 63.5 K/W, which is obtained using the conventional technology when the same substrate is used, from which it can be seen that the thermal resistance is reduced by 65%.

According to the present invention, the cost of the backlight unit can be reduced because the insulating substrate is used as the substrate thereof, and the luminance and lifespan of LEDs can be increased because heat can be effectively dissipated using the heat dissipation plates.

Furthermore, a very thin insulating film, instead of a conventional heat pad disposed between the substrate and the chassis, is employed, therefore thermal resistance is considerably reduced, thereby considerably increasing the amount of heat dissipation.

Furthermore, the area of the heat dissipation plate and the area of the through holes are determined at an appropriate ratio so that the dissipation of heat generated by the LEDs can be optimized through the convection and conduction of the heat dissipation plate, thereby maximizing the dissipation of heat.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A backlight unit equipped with Light-Emitting Diodes (LEDs), comprising:
    an insulating substrate provided with predetermined circuit patterns on one surface thereof;
    a plurality of LED packages mounted above the insulating substrate and electrically connected to the circuit patterns;
    an upper heat dissipation plate formed on the insulating substrate, and configured to come into contact with the circuit patterns and to dissipate heat generated in the LED packages;
    a lower heat dissipation plate formed on a remaining surface of the insulating substrate, and configured to transmit heat transmitted through the upper heat dissipation plate; and
    a chassis disposed in the remaining surface of the insulating substrate and fixedly combined with the insulating substrate,
    wherein the upper heat dissipation plate and the lower heat dissipation plate are connected to each other by at least one through hole that passes through the insulating substrate and is plated with plating material on an inner wall thereof, and the through hole and the upper heat dissipation plate have a predetermined area ratio,
    the insulating substrate is provided with an insulating film which is configured to cover the lower heat dissipation plate,
    wherein the insulating substrate and the chassis are combined with each other using a fastener penetrating at least a corner of the insulating substrate and the chassis.

2. The backlight unit as set forth in claim 1, wherein the upper heat dissipation plate and the lower heat dissipation plate are made of copper and each have a thickness of about 0.35 μm.

3. The backlight unit as set forth in claim 1, wherein the insulating film is applied through sputtering or spraying.

4. The backlight unit as set forth in claim 3, wherein the insulating film has a thickness of about 0.35 μm.

5. The backlight unit as set forth in claim 4, wherein the through holes are plated with copper on the inner walls thereof, but are not filled with filling material so as to reduce the weight of the backlight unit.

6. The backlight unit as set forth in claim 1, wherein the area ratio of the through hole and the upper heat dissipation plate ranges from 1:10 to 1:300.

7. The backlight unit as set forth in claim 1, wherein the insulating substrate is provided with the circuit patterns on an epoxy resin.

8. The backlight unit as set forth in claim 1, wherein the LED packages comprising:
    two LED electrodes connected to the circuit patterns;
    an LED chip mounted on one of the LED electrodes;
    a plastic mold casing protecting the LED electrode and the LED chip from the outside; and
    a lens covering the plastic mold casing.

9. The backlight unit as set forth in claim 1, wherein the chassis is made of metallic material having thermal conductivity.

10. The backlight unit as set forth in claim 1, wherein the fastener is a bolt.

11. A backlight unit equipped with Light-Emitting Diodes (LEDs), comprising:
    an insulating substrate provided with predetermined circuit patterns on the top surface thereof;
    a plurality of LED packages mounted above the insulating substrate and electrically connected to the circuit patterns;
    an upper heat dissipation plate formed on the top surface of insulating substrate, and configured to come into contact with the circuit patterns and to dissipate heat generated in the LED packages; and
    a lower heat dissipation plate formed on the bottom surface of the insulating substrate, and configured to transmit heat transmitted through the upper heat dissipation plate, wherein the upper heat dissipation plate and the lower heat dissipation plate are connected to each other by at least one through hole that passes through the insulating substrate and is plated with plating material on an inner wall thereof,
    an insulating film formed under the lower heat dissipation plate; and
    a chassis disposed under the insulating film to be fixedly combined with the insulating substrate and the insulating film,
    wherein the insulating substrate and the chassis are combined with each other using a fastener penetrating at least a corner of the insulating substrate and the chassis.

12. The backlight unit as set forth in claim 1, wherein the insulating substrate, the insulating film and the chassis are combined with each other using a fastener penetrating at least a portion of the insulating substrate, the insulating film and the chassis.

13. A backlight unit equipped with Light-Emitting Diodes (LEDs), comprising:

an insulating substrate provided with predetermined circuit patterns on the top surface thereof;

a plurality of LED packages mounted above the insulating substrate and electrically connected to the circuit patterns;

an upper heat dissipation plate formed on the top surface of insulating substrate, and configured to come into contact with the circuit patterns and to dissipate heat generated in the LED packages;

a lower heat dissipation plate formed on the bottom surface of the insulating substrate, and configured to transmit heat transmitted through the upper heat dissipation plate; and a chassis disposed under the lower heat dissipation plate to be fixedly combined with the insulating substrate, wherein the insulating substrate and the chassis are combined with each other using a fastener penetrating a portion of the insulating substrate and the chassis where the upper heat dissipation plate and the lower heat dissipation plate are not formed.

14. The backlight unit as set forth in claim 13, wherein the upper heat dissipation plate and the lower heat dissipation plate are connected to each other by at least one through hole that passes through the insulating substrate and is plated with plating material on an inner wall thereof.

15. The backlight unit as set forth in claim 13, further comprising:

an insulating film formed under the lower heat dissipation plate.

16. The backlight unit as set forth in claim 13, wherein the portion of the insulating substrate and the chassis is a corner of the insulating substrate and the chassis.

* * * * *